United States Patent [19]

Lode

[11] 4,250,447

[45] Feb. 10, 1981

[54] DIGITAL MULTIMETER WITH MORE CLOSELY SPACED RANGES

[76] Inventor: Tenny D. Lode, 1317 E. Belleview Ave., Littleton, Colo. 80121

[21] Appl. No.: 944,588

[22] Filed: Sep. 21, 1978

[51] Int. Cl.³ .............................................. G01R 15/08
[52] U.S. Cl. ................................................... 324/115
[58] Field of Search ................... 324/115, 99 D, 73 R; 340/347 AD, 347 NT

[56] References Cited

U.S. PATENT DOCUMENTS 2,509,415  5/1950  Bernreuter ........................... 324/115

Primary Examiner—Ernest F. Karlsen
Attorney, Agent, or Firm—Kinney, Lange, Braddock, Westman and Fairbairn

[57] ABSTRACT

The subject invention relates to digital multimeter instruments for the measurement of physical quantities and, more particularly, to increasing the effective measurement resolution and accuracy thereof. In one form, a multirange digital voltmeter is provided with scales and ranges in a 1-2-5-10 relationship. The voltmeter includes an analog-to-digital converter which is connected through a digital multiplier to a digital display. The multiplier provides multiplication ratios of 1, 2 or 5, depending on the selected scale. The displayed value will change in increments of 1, 2 or 5 units of the least significant displayed digit for a change of one unit of the analog-to-digital converter output, depending on the selected scale and corresponding multiplier setting. This allows the various scales to have at least approximately the same number of digital steps over their full ranges.

6 Claims, 4 Drawing Figures

DIGITAL MULTIMETER WITH MORE CLOSELY SPACED RANGES

BACKGROUND OF THE INVENTION

Conventional digital multimeters have ranges which are related by factors of 10. For example, a representative 3½-digit multirange DC voltmeter might have ranges of 0.000–1.999, 00.00–19.99 and 000.0–199.9 volts, with resolutions of 0.001, 0.01 and 0.1 volts per digital step respectively. Such an instrument might have a 3-position range switch in the form of a 3-position voltage attenuator connected between the voltage input terminals and a constant sensitivity analog-to-digital converter. The scales, ranges and resolutions for such a representative conventional digital voltmeter are listed in Table 1.

Digital multimeters typically use a dual slope integrator circuit to generate a pulse whose duration is proportional to an input voltage. The integrator circuit pulse duration is digitally measured by counting the number of clock pulses from a clock oscillator which occur during the integrator circuit pulse. In a typical 3½-digit meter, the counter range will be 0000 to 1999, with the counted digital values being displayed on a 3½-digit visible display.

With such digital multimeters, it is sometimes inconvenient that the resolution changes substantially from one range to the next. For example, with the previously described 3½-digit meter, a measurement of a value of approximately 1.5 volts can be made on the 2 volt scale with a resolution of 0.001 volts or 0.07% of the reading. However, a measurement of a value of approximately 2.5 volts must be made on the 20 volt scale, with a resolution of 0.01 volts or 0.4% of the reading.

SUMMARY OF THE INVENTION

In one form of the present invention, a digital multimeter is provided with scales and ranges which are related by factors of less than 10. The display is arranged so that each digital measurement step will correspond to an increment of more than one unit of the least significant displayed digit for at least some of the ranges. This allows the various scales and ranges to have, at least approximately, the same number of digital measurement steps over their full ranges.

TABLE 1

Voltage scales, ranges and resolutions for one form of conventional multirange digital voltmeter

| Scale (volts) | Range (volts) | Resolution (volts) |
|---|---|---|
| 2 | 0.000–1.999 | .001 |
| 20 | 0.00–19.99 | .01 |
| 200 | 0.0–199.9 | 0.1 |

For example, the previously described conventional 3½-digit multirange DC voltmeter had a total of 3 measurement ranges, and a digital output range of 2000 steps. A system incorporating the present invention might retain the digital range of 2000 steps. However, this digital range would be displayed as 0000–1999 in steps of 1, 0000–3998 in steps of 2 or 0000–9995 in steps of 5, depending on the selected measurement scale and range. The voltage measurement scales and ranges, and the resolutions corresponding to one digital step for an improved 7-range digital voltmeter are listed in Table 2.

The more closely spaced ranges will allow many measurements to be made with greater resolution and accuracy. Using the previous example, a measurement of a value of approximately 2.5 volts may be made on the 4 volt scale of the voltmeter of Table 2 with a resolution of 0.002 volts or 0.08% of the reading. This is a significant improvement over the 0.01 volt or 0.4% resolution which would be obtained with the conventional digital voltmeter of Table 1.

TABLE 2

Voltage scales, ranges and resolutions for one form of improved multirange digital voltmeter

| Scale (volts) | Range (volts) | Resolution (volts) |
|---|---|---|
| 2 | 0.000–1.999 | .001 |
| 4 | 0.000–3.998 | .002 |
| 10 | 0.000–9.995 | .005 |
| 20 | 0.00–19.99 | .01 |
| 40 | 0.00–39.98 | .02 |
| 100 | 0.00–99.95 | .05 |
| 200 | 0.0–199.9 | 0.1 |

DESCRIPTION OF THE PREFERRED EMBODIMENTS

Figure 1:
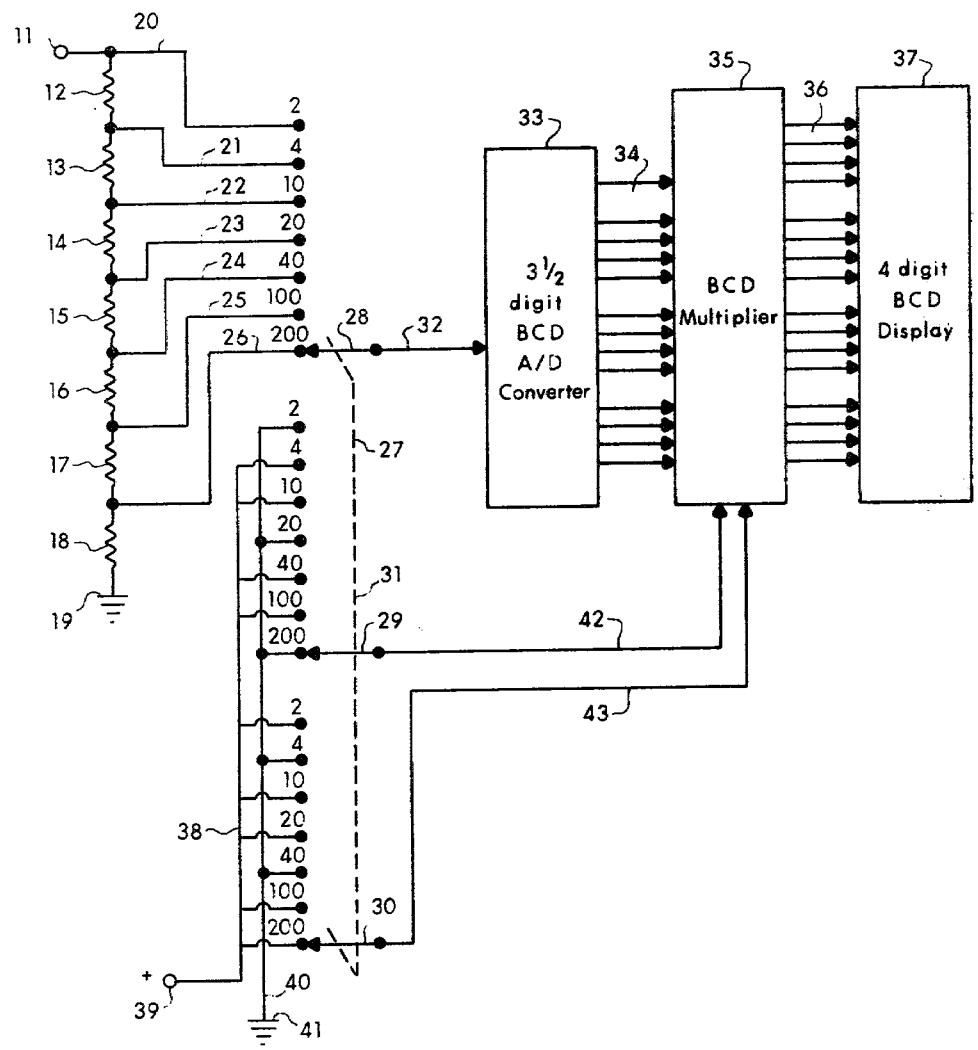
FIG. 1 is a diagrammatic illustration of a first form of the invention, showing a multirange digital voltmeter including a digital multiplier between an analog-to-digital converter and a digital display.

Referring to the drawings, FIG. 1 is a diagrammatic illustration of a first form of the invention showing a multirange digital voltmeter including a digital multiplier between an analog-to-digital converter and a digital display. In FIG. 1, analog input terminal 11 is connected via line 20 to a first side of the series connected string of resistors 12, 13, 14, 15, 16, 17 and 18. The second side of this resistor string is connected to ground 19. A three section, seven position switch 27 includes a first section with moveable arm 28, a second section with moveable arm 29 and a third section with moveable arm 30. The three switch sections are joined by link 31 so as to maintain corresponding positions. The circuit of FIG. 1 is a multirange digital voltmeter with individual voltage scales of 2, 4, 10, 20, 40, 100 and 200 volts, depending on the position of switch 27. The individual positions and stator terminals of switch 27 are identified by these voltage scale values. Line 20 connects from terminal 11 to a first 2 volt scale stator contact of the switch section of moveable arm 28. Line 21 connects from the junction of resistors 12 and 13 to a second, 4 volt scale stator contact, line 22 connects from the junction of resistors 13 and 14 to a third, 10 volt scale stator contact, line 23 connects from the junction of resistors 14 and 15 to a fourth, 20 volt scale stator contact, line 24 connects from the junction of resistors 15 and 16 to a fifth, 40 volt scale stator contact, line 25 connects from the junction of resistors 16 and 17 to a sixth, 100 volt scale stator contact, and line 26 connects from the junction of resistors 17 and 18 to a seventh, 200 volt scale stator contact of the switch section of moveable arm 28. Moveable arm 28 is connected via line 32 to an input of analog-to-digital converter 33. The digital output of converter 33 is connected via the set of 13 lines 34 to data inputs of multiplier 35, whose digital output is connected via the set of 16 lines 36 to digital display 37. The 4, 10, 40 and 100 volt scale stator contacts of the switch section of moveable arm 29, and the 2, 10, 20, 100 and 200 volt scale stator contacts of the switch section of moveable arm 30 are connected via line 38 to terminal 39. The 2, 20 and 200 volt scale stator contacts of the switch section of moveable arm 29, and the 4 and 40 volt scale stator contacts of the switch section of moveable arm 30 are connected via line 40 to ground 41. Moveable arms 29 and 30 are connected via lines 42 and 43 respectively to multiplier control inputs of multiplier 35.

Figure 2:
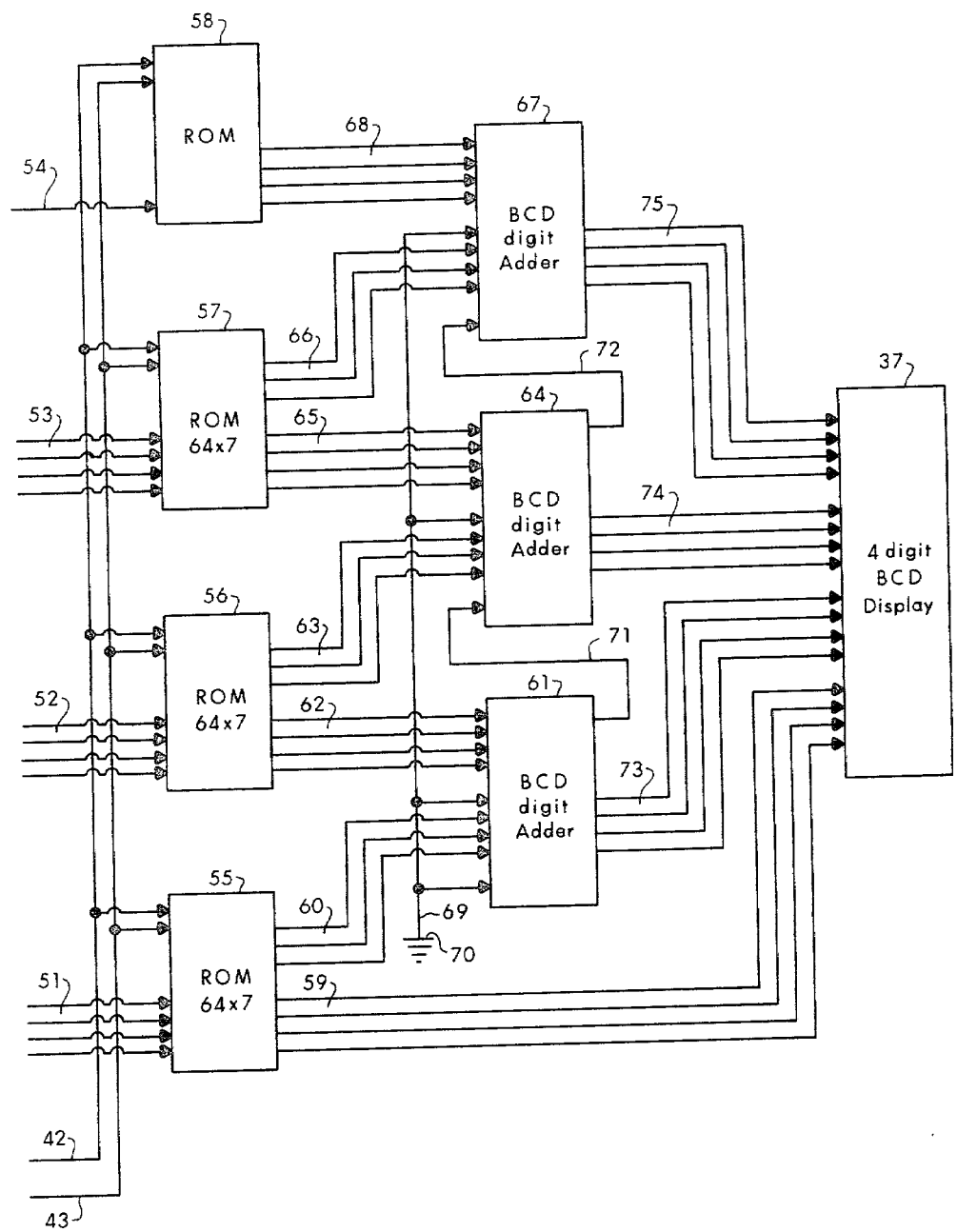
FIG. 2 is a diagrammatic illustration of a form of digital multiplier which may be used for digital multiplier 35 of FIG. 1.

FIG. 1 is a diagrammatic illustration of a seven range DC digital voltmeter whose scales, ranges, and resolutions correspond to those listed in Table 2. Converter 33 is a single range analog-to-digital converter with a digital output of 0000 through 1999 in BCD (binary coded decimal) form on lines 34, for analog inputs over a range of 0.000 through 1.999 volts on line 32. Such converters are well known and are used, for example, in conventional digital multimeters. Integrated circuit devices are currently available from a number of semiconductor manufacturers to provide the functions of converter 33. For example, converter 33 may be constructed with the Motorola MC14433 3½-digit analog-to-digital converter integrated circuit device plus a few peripheral components. Multiplier 35 is a digital multiplier which multiplies the digital number on lines 34 by a factor of 1, 2 or 5, and provides the resulting 4-digit BCD digital output on lines 36. A circuit which may be used for multiplier 35 is shown in FIG. 2, and will be subsequently described in greater detail. The multiplication factor of multiplier 35 is controlled by control signals on lines 42 and 43. Display 37 is a 4-digit BCD display which displays the four decimal digits corresponding to the four BCD data digits on lines 36.

Switch 27 is a seven position range switch to select the desired one of seven measurement scales or ranges. When switch 27 is in the 2 volt position, input terminal 11 is connected directly to line 32. Hence, that setting corresponds to a nominal two volt scale and a range of 0.000 to 1.999 volts. The series string of resistors 12 through 18 attenuates the input voltage on terminal 11 so that the line 21 voltage is one-half of the terminal 11 and line 20 voltage, relative to ground 19. Hence, when switch 27 is in the 4 volt position with moveable arm 28 connected to line 21, a 4 volt signal on terminal 11 will give a 2 volt signal on line 32. Hence, the 4 volt position of switch 27 gives a measurement scale of 4 volts. Similarly, the remaining five positions of switch 27 give voltage measurement scales of 10, 20, 40, 100 and 200 volts, in each case corresponding to a 2 volt full scale signal on line 32.

The attenuation ratios, between input terminal 11 and line 32, are 1.0, 0.5, 0.2, 0.1, 0.05, 0.02 and 0.01 for the 2, 4, 10, 20, 40, 100 and 200 volt positions of switch 27, respectively. Corresponding individual resistance values for resistors 12 through 18 are 0.5R, 0.3R, 0.1R, 0.05R, 0.03R, 0.1R and 0.01R for resistors 12, 13, 14, 15, 16, 17 and 18, respectively. R is the total series resistance of the string of resistors 12 through 18. An R value of the order of $10^6$ to $10^7$ ohms would be suitable for a general purpose multirange voltmeter.

The second and third sections of switch 27, including moveable arms 29 and 30 determine the logical control signals to multiplier 35 on lines 42 and 43. Multiplier 35 will multiply by a factor of 1 if the line 42 control signal is low or zero and the line 43 control signal is high or one; by a factor of 2 if the line 42 signal is high and the line 43 signal low; and by a factor of 5 if both the line 42 and 43 signals are high.

In this specification, it will be generally assumed that the arithmetic and logical functions are implemented with conventional semiconductor and integrated circuit devices, such as CMOS or TTL devices. With such circuit devices, a logical low or zero signal is normally represented by a voltage near ground or zero, and a logical high or one signal is represented by a more positive voltage value, such as +5 volts.

Terminal 39 is connected to a source of a positive voltage which corresponds to a high or logical one signal for the particular logical circuit elements within multiplier 35. For standard TTL circuit devices this would be a +5 volt source. Ground 41 provides a ground or zero volt signal which corresponds to a low or logical zero signal for multiplier 35. The connection pattern of lines 38 and 40 to the stator terminals of switch 27 are such that multiplier 35 will multiply by a factor of 1 on the 2, 20 and 200 volt scales, by a factor of 2 on the 4 and 40 volt scales, and by a factor of 5 on the 10 and 100 volt scales.

When switch 27 is in the 2 volt position, converter 33 will generate digital outputs of 0000 through 1999 for analog inputs of 0.000 through 1.999 volts on terminal 11. Multiplier 35 will multiply by a factor of 1, so the digital data which will be displayed in display 37 will be values of 0000 for 0.000 volts through 1999 for 1.999 volts. When switch 27 is in the second or 4 volt position, the terminal 11 signal is attenuated by a factor of 0.5 and converter 33 will generate digital outputs of 0000 through 1999 for analog inputs of 0.000 volts through 3.998 volts on terminal 11. Multiplier 35 will multiply the lines 34 digital signal by a factor of 2. Display 37 will display digital values of double the lines 34 values, for a digital range of 0000 through 3998, in steps of 2, for terminal 11 analog signals of 0.000 through 3.998 volts. When switch 27 is in third or 10 volt scale position, the terminal 11 signal is attenuated by a factor of 0.2 and converter 33 will generate digital output signals on lines 34 of 0000 through 1999 for terminal 11 analog input signals of 0.000 through 9.995 volts. Multiplier 35 will multiply the lines 34 digital values by a factor of 5. Display 37 will display digital values of 0000 through 9995 in steps of 5, for terminal 11 analog inputs of 0.000 through 9.995 volts.

The operation of the circuit of FIG. 1 on the 20 and 200 volt scales is similar to the operation on the 2 volt scale, with a multiplier 35 multiplication ratio of 1, except that the terminal 11 input signal is attenuated by factors of 0.1 and 0.01, respectively. The operation on the 40 volt scale is similar to the operation on the 4 volt scale, with a multiplier 35 multiplication ratio of 2, except that the terminal 11 input terminal is attenuated by a factor of 0.05. The operation on the 100 volt scale is similar to the operation on the 10 volt scale, with a multiplier 35 multiplication ratio of 5, except that the terminal 11 input signal is attenuated by a factor of 0.02.

Thus, the circuit of FIG. 1 will function as a seven range digital voltmeter whose scales, ranges and resolutions correspond to those listed in Table 2.

There are a number of ways in which a BCD digital multiplier such as multiplier 35 may be implemented. A way which is conceptually simple, but not necessarily economically attractive at the present time, is the use of a single ROM (read-only memory). Multiplier 35 may be a 15-bit input (32,768 word), 16 bits per word output ROM. The converter 33 output on lines 34 would be 13 of the input bits and multiplier control lines 42 and 43 would be the remaining two input bits. For each combination of converter 33 output and multiplier control signals, the appropriate 16 bits (or 4 BCD digits) would be transmitted via ROM output lines 36 to display 37.

Reference is now made to FIG. 2 which is a diagrammatic illustration of a form of digital multiplier which may be used for digital multiplier 35 of FIG. 1. FIG. 2 includes digital display 37, and multiplier control lines 42 and 43, which correspond to digital display 37 and multiplier control lines 42 and 43 of FIG. 1. The set of four lines 51 is connected to the four-line BCD (binary coded decimal) digit input of ROM (read-only memory) 55. Similarly, the set of four lines 52 is connected to the four-line BCD digit input of ROM 56, and the set of four lines 53 is connected to the four-line BCD digit input of ROM 57. Line 54 is connected to the least significant bit line of the BCD digit input of ROM 58. The four-line BCD digit output of ROM 55 is connected via the set of four lines 59 to the four-line BCD least significant digit input of digital display 37. The three-line BCD carry output of ROM 55 is connected via the set of three lines 60 to the three least significant bit inputs of the first BCD digit input of BCD digit adder 61. The four-line BCD digit output of ROM 56 is connected via the set of four lines 62 to the second BCD digit input of adder 61. The three-line BCD carry output of ROM 56 is connected via the set of three lines 63 to the three least significant bit inputs of the first BCD digit input of BCD digit adder 64. The four-line BCD digit output of ROM 57 is connected via the set of four lines 65 to the second BCD digit input of adder 64. The three-line BCD carry output of ROM 57 is connected via the set of three lines 66 to the three least significant bit inputs of the first BCD digit input of BCD digit adder 67. The four-line BCD digit output of ROM 58 is connected via the set of four lines 68 to the second BCD digit input of adder 67. The most significant bit inputs of the first BCD digit inputs of adders 61, 64 and 67, and the carry input of adder 61, are connected via line 69 to ground 70. The carry output of adder 61 is connected via line 71 to the carry input of adder 64. The carry output of adder 64 is connected via line 72 to the carry input of adder 67. The four-line BCD digit output of adder 61 is connected via the set of four lines 73 to a second four-line BCD digit input of display 37, the four-line BCD digit output of adder 64 is connected via the set of four lines 74 to a third four-line BCD digit input of display 37, and the four-line BCD digit output of adder 67 is connected via the set of four lines 75 to a fourth four-line BCD digit input of display 37.

If the circuit of FIG. 2 is used for multiplier 35 of FIG. 1, lines 34 would be connected to lines 51, 52, 53 and 54. Lines 59, 73, 74 and 75, collectively, correspond to lines 36.

FIG. 2 illustrates a form of digital multiplier which may be used for multiplier 35 of FIG. 1, and which would at the present time be more economical than a single ROM. The operation of the circuit of FIG. 2 is quite similar the way that one might multiply a 4-digit decimal number by a single digit with pencil and paper. The larger number would be multiplied one digit at a time to give a series of one or two digit partial products. These partial products would then be added, at appropriate decimal positions, to give the final product.

The circuit of FIG. 2 uses four individual 6-bit input (64 word), 7 bits per word output, ROMs as individual decimal digit multipliers, and combines the individual multiplied BCD decimal digit signals via BCD digit adders. Table 3 illustrates the operation of a single digit ROM decimal multiplier for multiplication ratios of 1, 2 and 5. This multiplication relationship is implemented in each of ROMs 55, 56, 57 and 58 of FIG. 2.

The ROM contents in binary coded form are shown in Table 4. In Table 4, the output values are shown as "0" or "1" for binary 0 or 1 values, or as a "—" for bits which are not used and whose values do not affect the normal operation of the multiplier circuit. In Table 4, the left bit of the multiplier input corresponds to the line 42 signal and the right bit corresponds to the line 43 signal. The four bits of the digit input column correspond to the four BCD digit signals on lines 51 to ROM 55, and on lines 52, 53 and 54 to ROMs 56, 57 and 58, respectively. The carry output column corresponds to the lines 60, 63 and 66 outputs of ROMs 55, 56 and 57, respectively. The digit output column corresponds to the lines 59, 62, 65 and 68 outputs of ROMs 55, 56, 57 and 58, respectively. The coding of the multiplier input is in almost binary form, with combinations of 01, 10 and 11, representing multiplication ratios of 1, 2 and 5, respectively. The other signal sets, the digit input, carry output and digit output signals, are in normal binary coded form.

TABLE 3

| Digit multiplier for x1, x2 or x5 | | | |
|---|---|---|---|
| Input | | Output | |
| mult. | digit | carry | digit |
| 1 | 0 | 0 | 0 |
| " | 1 | 0 | 1 |
| " | 2 | 0 | 2 |
| " | 3 | 0 | 3 |
| " | 4 | 0 | 4 |
| 1 | 5 | 0 | 5 |
| " | 6 | 0 | 6 |
| " | 7 | 0 | 7 |
| " | 8 | 0 | 8 |
| " | 9 | 0 | 9 |
| 2 | 0 | 0 | 0 |
| " | 1 | 0 | 2 |
| " | 2 | 0 | 4 |
| " | 3 | 0 | 6 |
| " | 4 | 0 | 8 |
| 2 | 5 | 1 | 0 |
| " | 6 | 1 | 2 |
| " | 7 | 1 | 4 |
| " | 8 | 1 | 6 |
| " | 9 | 1 | 8 |
| 5 | 0 | 0 | 0 |
| " | 1 | 0 | 5 |
| " | 2 | 1 | 0 |
| " | 3 | 1 | 5 |
| " | 4 | 2 | 0 |
| 5 | 5 | 2 | 5 |
| " | 6 | 3 | 0 |
| " | 7 | 3 | 5 |
| " | 8 | 4 | 0 |

TABLE 3-continued

| Digit multiplier for x1, x2 or x5 | | | |
|---|---|---|---|
| Input | | Output | |
| mult. | digit | carry | digit |
| " | 9 | 4 | 5 |

TABLE 4

| ROM BCD digit multiplier for x1, x2 or x5 | | | |
|---|---|---|---|
| Input | | Output | |
| mult. | digit | carry | digit |
| 00 | 0000 | — | — |
| " | 0001 | — | — |
| " | 0010 | — | — |
| " | 0011 | — | — |
| " | 0100 | — | — |
| " | 0101 | — | — |
| " | 0110 | — | — |
| " | 0111 | — | — |
| 00 | 1000 | — | — |
| " | 1001 | — | — |
| " | 1010 | — | — |
| " | 1011 | — | — |
| " | 1100 | — | — |
| " | 1101 | — | — |
| "1110 | — | — | — |
| " | 1111 | — | — |
| 01 | 0000 | 000 | 0000 |
| " | 0001 | 000 | 0001 |
| " | 0010 | 000 | 0010 |
| " | 0011 | 000 | 0011 |
| " | 0100 | 000 | 0100 |
| " | 0101 | 000 | 0101 |
| " | 0110 | 000 | 0110 |
| " | 0111 | 000 | 0111 |
| 01 | 1000 | 000 | 1000 |
| " | 1001 | 000 | 1001 |
| " | 1010 | — | — |
| " | 1011 | — | — |
| " | 1100 | — | — |
| " | 1101 | — | — |
| " | 1110 | — | — |
| " | 1111 | — | — |
| 10 | 0000 | 000 | 0000 |
| " | 0001 | 000 | 0010 |
| " | 0010 | 000 | 0100 |
| " | 0011 | 000 | 0110 |
| " | 0100 | 000 | 1000 |
| " | 0101 | 001 | 0000 |
| " | 0110 | 001 | 0010 |
| " | 0111 | 001 | 0010 |
| " | 0111 | 001 | 0100 |
| 10 | 1000 | 001 | 0110 |
| " | 1001 | 001 | 1000 |
| " | 1010 | — | — |
| " | 1011 | — | — |
| " | 1100 | — | — |
| " | 1101 | — | — |
| " | 1110 | — | — |
| " | 1111 | — | — |
| 11 | 0000 | 000 | 0000 |
| " | 0001 | 000 | 0101 |
| " | 0010 | 001 | 0000 |
| " | 0011 | 001 | 0101 |
| " | 0100 | 010 | 0000 |
| " | 0101 | 010 | 0101 |
| " | 0110 | 011 | 0000 |
| " | 0111 | 011 | 0101 |
| 11 | 1000 | 100 | 0000 |
| " | 1001 | 100 | 0101 |
| " | 1010 | — | — |
| " | 1011 | — | — |
| " | 1100 | — | — |
| " | 1101 | — | — |
| " | 1110 | — | — |
| " | 1111 | — | — |

The least significant decimal digit of the converter 33 output is connected via lines 51 to the digit input of ROM 55. The multiplied digit output of ROM 55 is connected via line 59 to display 37, where it is displayed as the least significant decimal digit of the multiplier 35 output.

BCD (binary coded decimal) digit adders 61, 64 and 67 are individual digit adder circuits whose inputs are two binary coded decimal digits and a carry from a lower stage, if any, and whose outputs are a binary coded decimal digit and a carry to a higher stage. Suitable BCD digit adders are commercially available as integrated circuit devices, such as the Motorola MC14560 CMOS BCD digit adder. The carry output of ROM 55 from the multiplication of the least significant decimal digit of the converter 33 output is transmitted via lines 60 to a first digit input of adder 61. The carry input to adder 61, the lower left hand input line, is connected to ground line 69 to furnish an effective constant carry input of zero. The second least significant decimal digit of the converter 33 output is connected via lines 52 to the digit input of ROM 56. The multiplied digit output of ROM 56 is connected via lines 62 to a second digit input of adder 61, where it is added to the carry output of ROM 55 to give the second least significant digit of the multiplier 35 output. This digit output is connected via lines 73 to display 37. The carry resulting from the addition within adder 61 is connected via line 71 to the carry input of adder 64.

The operation of the circuit of FIG. 2 for the digits on lines 53 and line 54 is generally similar to the operation for the digit on lines 52. The result is that a 4-digit BCD signal on lines 51, 52, 53 and 54, over a range of 0000–1999, will be multiplied by a factor of 1, 2 or 5 and transmitted to display 37 via lines 59, 73, 74 and 75 as a 4-digit decimal number over a range of 0000–1999, 0000–3998 or 0000–9995, for multiplication ratios of 1, 2 and 5 respectively.

Since converter 33 has a 3½-digit output, the most significant digit signal on line 54 will have only 0 or 1 values. ROM 58 may be similar to ROMs 55, 56 and 57 and implement the relationships shown in Table 4. In that case, the three higher bits of the BCD digit input to ROM 58 would be permanently connected to a ground or zero signal. Alternatively, ROM 58 may be a smaller individual ROM or a network of logical gates to implement the relatively simple multiplication function required of it.

Figure 3:
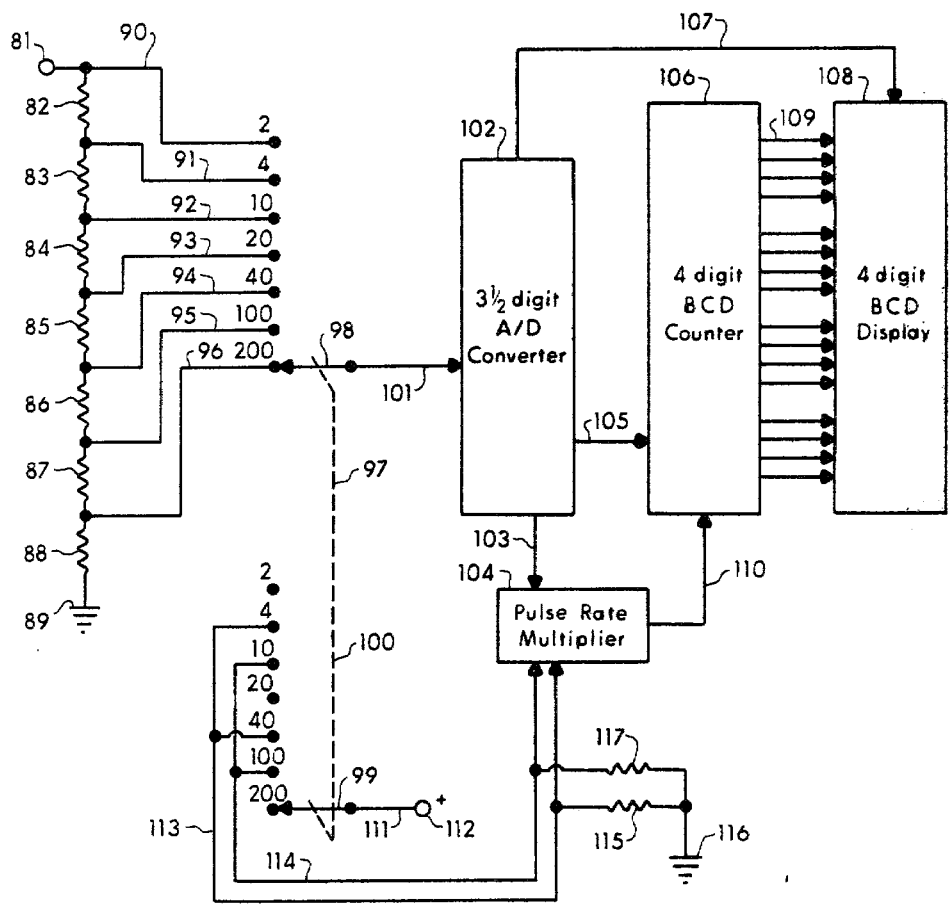
FIG. 3 is a diagrammatic illustration of second form of the invention, showing a multirange digital voltmeter including a variable pulse rate multiplier connected to a counter as a means for counting by particular increments.

Reference is now made to FIG. 3 which is a diagrammatic illustration of a second form of the invention showing a multirange digital voltmeter including a variable pulse rate multiplier connected to a counter as a means for counting by particular increments. In FIG. 3, analog input terminal 81 is connected via line 90 to a first side of the series connected string of resistors 82, 83, 84, 85, 86, 87 and 88. The second side of this resistor string is connected to ground 89. A two pole, seven position switch 97 includes a first section with moveable arm 98, and a second section with moveable arm 99. The two switch sections are joined via link 100 so as to maintain corresponding positions. The circuit of FIG. 3 is a multirange digital voltmeter with scales of 2, 4, 10, 20, 40, 100 and 200 volts, depending on the position of switch 97. The individual positions and stator terminals of switch 97 are identified by these voltage scale values. Line 90 connects from terminal 81 to a first, 2 volt scale stator terminal of the switch section of moveable arm 98. Line 91 connects from the junction of resistors 82 and 83 to a second, 4 volt scale stator terminal, line 92 connects from the junction of resistors 83 and 84 to a third, 10 volt scale stator terminal, line 93 connects from the junction of resistors 84 and 85 to a fourth, 20 volt scale stator terminal, line 94 connects from the junction of resistors 85 and 86 to a fifth, 40 volt scale stator terminal, line 95 connects from the function of resistors 86 and 87 to a sixth, 100 volt scale stator terminal, and line 96 connects from the junction of resistors 87 and 88 to a seventh, 200 volt scale stator terminal, of the switch section of moveable arm 98. Moveable arm 98 is connected via line 101 to an input of analog-to-digital converter 102. A pulse output of converter 102 is connected via line 103 to an input of pulse rate multiplier 104. A first control output of converter 102 is connected via line 105 to a control input of four-digit BCD digital counter 106, and a second control output of converter 102 is connected via line 107 to a control input of digital display 108. Digital data outputs of counter 106 are connected via the set of 16 lines 109 to digital data inputs of four-digit BCD display 108. The output of pulse rate multiplier 104 is connected via line 110 to the count input of counter 106. Moveable arm 99 of switch 97 is connected via line 111 to terminal 112. The 4 and 40 volt scale stator terminals of the switch selection of moveable arm 99 are connected via line 113 to a first multiplier control input of pulse rate multiplier 104. The 10 and 100 volt scale stator terminals of the switch section of moveable arm 99 are connected via line 114 to a second multiplier control input of pulse rate multiplier 104. The 2, 20 and 200 volt scale stator terminals of the switch section of moveable arm 99 are not connected. Resistor 115 is connected between line 113 and ground 116, and resistor 117 is connected between line 114 and ground 116.

Figure 4:
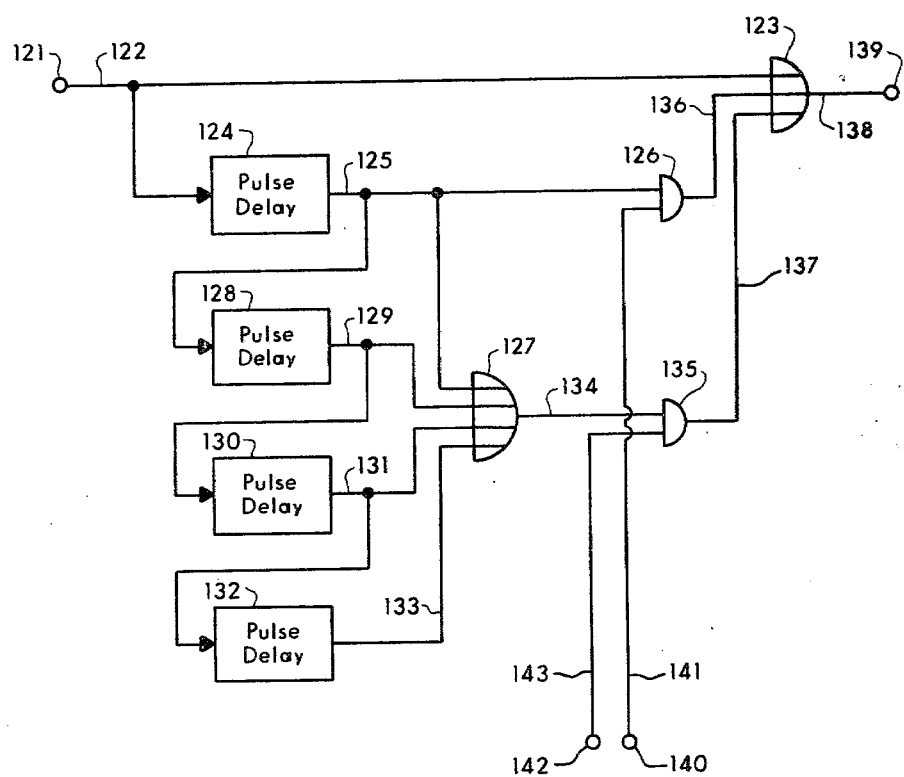
FIG. 4 is a diagrammatic illustration of a form of pulse rate multiplier which may be used for pulse rate multiplier 104 of FIG. 3.

The operation of the circuit of FIG. 3 generally resembles the operation of the circuit of FIG. 1, except for the use of a different form of digital multiplication. Converter 102 generally resembles converter 33 of FIG. 1, except that some of what would be internal signals of converter 33 are brought out in place of the 3½-digit output signals. The analog signal on input terminal 81 is attenuated by a factor which is determined by the position of switch 97, and is applied to the analog input of converter 102 on line 101 as a 0.000–1.999 volt signal. Line 103 carries a group of from 0 to 1999 pulses during each conversion cycle of converter 102, which indicates the value of the line 101 analog signal. In a more conventional digital multimeter, these pulse groups would be counted and displayed in a normal manner. The individual pulses on line 103 are multiplied by pulse rate multiplier 104, so that they become groups of one, two or five individual pulses which are transmitted to counter 106 on line 110. The multiplication ratio of multiplier 104 depends on the line 113 and line 114 control signals. A circuit which may be used for pulse rate multiplier 104 is shown in FIG. 4, and will be subsequently described in greater detail.

Line 105 carries a counter clear signal to clear counter 106 before the counting of each pulse group. Line 107 carries a transfer signal to cause display 108 to sample, hold and display the contents of counter 106 after the completion of each individual counting process. The entire cycle of clearing counter 106, converting the line 101 analog signal into groups of pulses on lines 103 and 110, the counting of the line 110 pulses via counter 106, the sampling of the counter 106 count value, and the holding and displaying of the counted value in display 108 will normally occur several times per second, so that it will appear to a user of the instrument to be a nearly continuous measurement process. Terminal 112 is connected to a source of a positive voltage which will serve as a logical high or one signal for the control of pulse rate multiplier 104.

The attention ratios, between input terminal 81 and line 101, are 1.0, 0.5, 0.2, 0.1, 0.05, 0.02 and 0.01 for the 2, 4, 10, 20, 40, 100 and 200 volt positions of switch 97, respectively. The individual resistance values for resistors 82 through 88 may be as described for resistors 12 through 18 of FIG. 1.

When switch 97 is in the 2, 20 or 200 volt positions, lines 113 and 114 will carry logical low or zero signals because of being grounded through resistors 115 and 117. Pulse rate multiplier 104 will multiply the line 103 pulse stream by a factor of 1. The display 108 values will vary over a range of 0000–1999 in steps of 1, for voltage measurement ranges of 0.000–1.999, 00.00–19.99 or 000.0–199.9 volts in steps of 0.001, 0.01 or 0.1 volts, respectively. When switch 97 is in the 4 or 40 volt positions, lines 113 and 114 will carry logical high or one and low or zero signals respectively. Pulse rate multiplier 104 will multiply the line 103 pulse stream by a factor of 2. The display 108 values will vary over a range of 0000–3998 in steps of 2, for voltage measurement ranges of 0.000–3.998 or 00.00–39.98 volts in steps of 0.002 or 0.02 volts, respectively. When switch 97 is in the 10 or 100 volt positions, lines 113 and 114 will carry logical zero and one signals respectively. Pulse rate multiplier 104 will multiply the line 103 pulse stream by a factor of 5. The display 108 values will vary over a range of 0000–9995 in steps of 5, for voltage measurement ranges of 0.000–9.995 or 00.00–99.95 volts in steps of 0.005 or 0.05 volts, respectively. Hence, the system of FIG. 3 will function as a multirange digital voltmeter with the measurement scales, ranges and resolutions of Table 2.

Reference is now made to FIG. 4 which is a diagrammatic illustration of a form of digital pulse rate multiplier which may be used for pulse rate multiplier 104 of FIG. 3. In FIG. 4, pulse input terminal 121 is connected via line 122 to a first input of three-input OR gate 123 and to the input of pulse delay 124. The output of pulse delay 124 is connected via line 125 to a first input of two-input AND gate 126, to a first input of four-input OR gate 127 and to the input of pulse delay 128. The output of pulse delay 128 is connected via line 129 to a second input of OR gate 127 and to the input of pulse delay 130. The output of pulse delay 130 is connected via line 131 to a third input of OR gate 127 and to the input of pulse delay 132. The output of pulse delay 132 is connected via line 133 to a fourth input of OR gate 127. The output of OR gate 127 is connected via line 134 to a first input of two-input AND gate 135. The output of AND gate 126 is connected via line 136 to a second input of OR gate 123, and the output of AND gate 135 is connected via line 137 to a third input of OR gate 123. The output of OR gate 123 is connected via line 138 to pulse output terminal 139. Control input terminal 140 is connected via line 141 to a second input of AND gate 126, and control input terminal 142 is connected via line 143 to a second input of AND gate 135.

If the circuit of FIG. 4 is used for pulse rate multiplier 104 of FIG. 3, terminal 121 would be connected to line 103, terminal 139 to line 110, terminal 140 to line 113 and terminal 142 to line 114.

For purposes of description, let us assume that the pulse stream on line 103 of FIG. 3, and terminal 121 and line 122, consists of pulses approximately 3 microseconds wide with a spacing which is not less than 50 microseconds, corresponding to a repetition rate of 20 kilohertz or less. It would then be convenient to have pulse delays 124, 128, 130 and 132 each generate 3 microsecond output pulses delayed by approximately 6 microseconds from their input pulses. Pulse delays of this general type may be implemented in a variety of manners. For example, pulse delays 124, 128, 130 and 132 may each be implemented as a cascaded pair of monostable multivibrators triggered by the trailing edges of their input pulses. An input pulse on terminal 121 and line 122 beginning at 0 microseconds and ending at 3 microseconds would trigger the first monostable multivibrator within pulse delay 124 at 3 microseconds. The first monostable multivibrator would then generate an internal pulse lasting from 3 to 6 microseconds. The trailing edge of this internal pulse at 6 microseconds would trigger the second monostable multivibrator of pulse delay 124, which would generate an output pulse on line 125 beginning at 6 microseconds and ending at 9 microseconds. Thus, an input pulse on line 122 will cause the generation of a delayed pulse on line 125. Similarly, pulse delay 128 will generate a line 129 pulse beginning at 12 microseconds and ending at 15 microseconds, pulse delay 130 will generate a line 131 pulse beginning at 18 microseconds and ending at 21 microseconds, and pulse delay 132 will generate a line 133 pulse beginning at 24 microseconds and ending at 27 microseconds. The overall function of the chain of pulse delays 124, 128, 130 and 132 is to generate a set of four delayed pulses on lines 125, 129, 131 and 133 which are not coincident with the terminal 121, line 122 input pulse, or with each other. The non-coincident pulses on lines 122, 125, 129, 131 and 133 may be combined via a logical OR operation to obtain a group of from one to five pulses for each single pulse on terminal 121.

The terminal 121 pulse is connected via line 122 and OR gate 123 to line 138 and terminal 139. Hence, the terminal 121 input pulse always appears on output terminal 139. If terminals 140 and 142 both carry logical low or zero signals, AND gates 126 and 135 will be off so that no pulses other than the terminal 121 pulse will appear on terminal 139. If the terminal 140 signal is high or one, and the terminal 142 signal is low or zero, AND gate 126 will be enabled so that the pulse delay 124 output on line 125 will be coupled through OR gate 123 to terminal 139. Each terminal 121 input pulse will then generate a group of two output pulses on terminal 139. If the terminal 140 signal is low or zero, and the terminal 142 signal is high or one, AND gate 135 will be enabled. OR gate 127 combines the outputs of pulse delays 124, 128, 130 and 132 into a group of four successive pulses on line 134 for each terminal 121 pulse. The gate 127 output pulses on line 134 pass through gate 135 and line 137 to OR gate 123, where they are combined with the terminal 121 input pulse. Then for each terminal 121 input pulse, the terminal 139 output will be a group of five successive pulses. Hence, the circuit of FIG. 4 will function as a pulse rate multiplier. It will generate a group of 1, 2 or 5 terminal 139 output pulses for each individual terminal 121 input pulse, depending on the terminal 140 and 142 control signals, thereby multiplying the total number of terminal 121 input pulses by a factor of 1, 2 or 5.

The preceding description has been in terms of specific forms of the present invention and their implementation in specific manners with specific components and elements. Many variations are possible within the spirit of the present invention, which may be employed individually or in combination. A few of these possible variations are described below.

For convenience, the preceding description has been primarily in terms of a particular typical 3½-digit multirange digital voltmeter. The concept may be extended to measurement systems of greater or lesser resolution and/or accuracy, the measurement of other electrical quantities such as AC voltages, currents, resistances, impedances, etc., and/or the measurement of various other quantities such as temperature, pressure, etc.

The preceding description has been in terms of digital multimeters with ranges related in proportion to a 1, 2, 5, 10, etc. sequence. While such a sequence is convenient for use with decimal digital instruments, other sequences, such as a 1, 3, 10 sequence and/or other relationships may also be used.

Features often incorporated in conventional digital multimeters, such as the measurement and display of the polarity of DC voltages and currents, over range indication, and the display of a decimal point corresponding to the selected instrument range, have not been discussed. These and/or other desired features may be included in multimeters constructed in accordance with the present invention.

In some multimeter instruments, the range selection is as least in part automatic and controlled by the measured value, and/or remotely controlled. The subject invention may be used in combination with such automatic and/or remote range controls.

The preceding description has been in terms of decimal digital instruments. Substantially similar techniques may be used for other digital systems, for example, for octal or base 8 digital measurement systems.

The preceding description has been primarily in terms of instruments in which a visible display is provided for an operator using the instrument. The invention is also applicable to instruments in which measured digital values are further processed within the instrument and/or transmitted to other instruments in a variety of manners.

In some digital multimeter systems, digital data is transmitted between integrated circuit devices in a serial or time multiplex manner, for example, one decimal digit at a time, to reduce the number of connecting lines external to the integrated circuit devices. In such instances, it may be desirable to perform multiplications and/or other manipulations of the digital data in a serial manner compatible with the multiplex data transmission pattern. Instruments incorporating a microprocessor may use the microprocessor for the multiplication and manipulation of the display values.

The preceding description has mentioned the use of conventional semiconductor and integrated circuit devices, such as CMOS and TTL devices, and the use of signal levels in which a logical zero is represented by a voltage near zero or ground and a logical one is represented by a more positive voltage value. Implementations of the present invention are not limited to such devices or signal levels, but may be with many present and/or future circuit devices, means and/or signal levels. Implementations of the present invention may be with other than binary or two-state logical and digital elements.

I claim:

1. A multirange meter for the digital measurement of an analog signal including range selection means having a plurality of selectable measurement ranges;

first means connected to said range selection means to receive the analog signal and to attenuate the analog signal and to provide an attenuated analog output signal as a function of the range selected by the range selection means;

converting means coupled to receive and to convert each attenuated analog output signal into a digital signal having a predetermined number of measurement steps;

control means generating a control signal which changes as a function of the range selected by said range selection means;

multiplying means to receive said digital signal from said converting means and interconnected with said control means for multiplying said digital signal from said converting means by a function determined by the control signal provided for that particular range and which is a different multiplier for each of a plurality of the selectable ranges; and display means to display a digital representation of said multiplied digital signal from said multiplying means.

2. The multirange meter of claim 1 wherein said multiplying means comprises:

a plurality of read-only-memories to receive said digital signal under control of said control signal, and a plurality of binary-coded-decimal adders coupled to receive outputs from said read-only-memories for generating said multiplied digital signal.

3. The multirange meter of claim 1 wherein said multiplying means comprises a pulse rate multiplier to receive said digital signal and under control of said control signal for multiplying said digital signal, and coupling means comprises a binary-coded-decimal counter under control of said converting means.

4. In an improved multirange meter for the digital measurement of an analog signal having means including a selector switch having a plurality of selectable ranges and including means connected to receive the analog signal and to generate upon operation of said selector switch an attenuated analog signal, comprising said analog signal attenuated by a predetermined amount corresponding to the selected range of said switch, means coupled to receive each attenuated analog signal for converting such attenuated analog signal into a corresponding digital signal having a predetermined number of discrete measurement steps, and means for displaying a decimal value corresponding to the value of said analog signal, the improvement comprising:

control means coupled to said switch to provide a multiplier signal which is a function of the range selected by the switch and which multiplier signal is different for different selected ranges of the switch, multiplier means to receive said digital signal from said converting means and interconnected with said control means for multiplying said digital signal from said converting means by a quantity determined by the multiplier signal for the selected range, said multiplier signal controlling the multiplier means to selectively multiply the digital signal by at least the integers 1, 2 or 5 for separate ranges, respectively, to provide measurement steps at those integers, and means coupling said multiplied digital signal from said multiplier means to said display means.

5. A multiple range meter for the digital measurement of an analog signal, said meter comprising:

an attenuator coupled to receive said analog signal for generating at least three attenuator output signals including a first attenuator output signal corresponding in magnitude to a first known fraction of said analog signal, a second attenuator output signal corresponding in magnitude to a second different known fraction of the magnitude of said analog signal, and a third attenuator output signal corresponding in magnitude to a third known fraction of the magnitude of said analog signal which is different from the first and second fractions, range selection means coupled to the attenuator and having selectable measurement ranges corresponding to the number of attenuator output signals provided, said range selection means providing the respective attenuator output signal to an output for each selectable measurement range, and means for generating a separate control signal identifying the respective measurement range selected, converting means coupled to the output for converting the signal at the output into a digital signal having a predetermined number of measurement steps, multiplying means coupled to receive said digital signal from said converting means and to multiply said digital signal by one of a plurality of integers, comprising the integers corresponding to the reciprocals of the first, second and third fractions, as determined by the value of said control signal and thereby being correlated to the first, second and third attenuator output signals, respectively, and display means for displaying a decimal value of said analog signal.

6. A multirange meter for the digial measurement of an analog signal, said meter comprising:

an attenuator coupled to said analog signal for generating a series of attenuator output signals which are functions of the analog signal and wherein the successive attenuator output signals form a series generated by other than a constant multiplier of the preceeding attenuator output signal in the series, said analog signal thereby being a non-constant multiple of each attenuator output signal, selector means for selecting one of the series of attenuator output signals, said selector means having means for selectively providing each attenuator output signal at a selector output, means for providing a control signal which is a function of the respective attenuator output signal selected by the selector means, means coupled to said selector output for converting the signal at the selector output into a digital signal having at maximum value a predetermined number of measurement steps, multiplying means for multiplying said digital signal by a multiplier numeral which divides evenly into the number of measurement steps and which multiplier is determined by the control signal, and means coupled to the multiplying means for displaying a digital value which is a function of the multiplied digital signal and represents the decimal value of said analog signal with a resolution determined by the value of the multiplier numeral.

* * * * *